United States Patent
Spitler et al.

(10) Patent No.: US 6,359,211 B1
(45) Date of Patent: Mar. 19, 2002

(54) SPECTRAL SENSITIZATION OF NANOCRYSTALLINE SOLAR CELLS

(75) Inventors: Mark T. Spitler, Concord; Anne Ehret, Malden; Louis S. Stuhl, Bedford, all of MA (US)

(73) Assignee: Chemmotif, Inc., Concord, MA (US)

( * ) Notice: Subject to any disclaimer, the term of this patent is extended or adjusted under 35 U.S.C. 154(b) by 0 days.

(21) Appl. No.: 09/596,819

(22) Filed: Jun. 19, 2000

Related U.S. Application Data

(60) Provisional application No. 60/139,648, filed on Jun. 17, 1999.

(51) Int. Cl.[7] .......................... H01L 31/04; H01L 51/20; H01L 51/30; H01G 9/20
(52) U.S. Cl. .................. 136/263; 136/252; 136/256; 429/111; 257/40; 257/431; 257/43; 250/200; 362/800; 428/690; 428/691; 428/702
(58) Field of Search ................. 136/263, 252, 136/256; 429/111; 257/40, 431, 43; 250/200; 362/800; 428/690, 702, 691

(56) References Cited

U.S. PATENT DOCUMENTS 6,028,265 A * 2/2000 Ono et al. ................. 136/263
6,043,428 A * 3/2000 Han et al. .................. 136/263
6,084,176 A * 7/2000 Shiratsuchi et al. ........ 136/263

OTHER PUBLICATIONS

Ehret et al, "Variation of carboxylate–functionalized cyanine dyes to produce efficient spectral sensitization of nanocrystalline solar cells," Electrochimica Acta, 45 (2000), pp. 4553–4557.*

* cited by examiner

*Primary Examiner*—Alan Diamond
(74) *Attorney, Agent, or Firm*—Weingarten, Schurgin, Gagnebin & Hayes, LLP

(57) ABSTRACT

This invention relates to dye sensitized polycrystalline photoelectrochemical solar cells for use in energy transduction from light to electricity. It concerns the utility of highly absorbing organic chromophores as sensitizers in such cells and the degree to which they may be utilized alone and in combination to produce an efficient photoelectrochemical cell, e.g., a regenerative solar cell.

18 Claims, 4 Drawing Sheets

SPECTRAL SENSITIZATION OF NANOCRYSTALLINE SOLAR CELLS

CROSS REFERENCE TO RELATED APPLICATIONS

This application claims the priority of U.S. Provisional Application No. 60/139,648 filed Jun. 17, 1999, entitled, SPECTRAL SENSITIZATION OF NANOCRYSTALLINE SOLAR CELLS, the whole of which is hereby incorporated by reference herein.

STATEMENT REGARDING FEDERALLY SPONSORED RESEARCH OR DEVELOPMENT

Part of the work leading to this invention was carried out with United States Government support provided under Contract No. DE-FG02-98ER82552 from the Department of Energy. Therefore, the U.S. Government has certain rights in this invention.

BACKGROUND OF THE INVENTION

Spectral sensitization of semiconductor solids in photoelectrochemical cells can serve as an effective means of solar energy transduction. These photoelectrochemical solar cells are known to be easily assembled and to consist of inexpensive materials.

In these cells, the semiconductor solids themselves are transparent to light but can be sensitized to this light through the use of sensitizing agents that absorb the light and transduce it into electrical power or an electrical signal. This sensitization occurs through charge injection into the semiconductor from the excited state of the sensitizer. Metal oxide semiconductors such as zinc oxide or titanium dioxide are very often used in this role. Sensitizers consisting of transition metal complexes or inorganic colloids as well as organic molecules are known.

It is known that solar cells assembled from such materials can attain power conversion efficiencies that approach 10% when exposed to AM 1.5 solar radiation. These solar cells employ nanocrystalline metal oxide semiconductors covered with transition metal complexes as sensitizers (Gratzel et al., U.S. Pat. Nos. 4,927,721 and 5,350,644). The solids are mesoporous and have a high surface area on which the absorbing, sensitizing layer can be formed. This results in a high absorptivity of light in the cell.

Transition metal ruthenium complexes such as Ru(II) (2,2'-bipyridyl-4,4'dicarboxylate)$_2$(NCS)$_2^{4-}$ (N) have been found to be efficient sensitizers and can be attached to the metal oxide solid through carboxyl or phosphonate groups on the periphery of the compounds. When transition metal ruthenium complexes are used as sensitizers, however, they must be applied to the nanocrystalline layers of the semiconductor oxides in the solar cell in a coat as thick as 10 micrometers or thicker in order to absorb sufficient solar radiation to attain the 10% power conversion efficiencies. It would be desirable to minimize the thickness of solar cells to reduce the internal resistance to current flow, which can be significant with these nanocrystalline materials.

It is recognized that organic dyes can have a much greater inherent ability to absorb light, and their use in a solar cell would reduce its thickness and thereby improve its utility. A typical organic dye can have an extinction coefficient for absorption of about $10^5$ M$^{-1}$cm$^{-1}$ or more as compared with $1-3\times10^4$ M$^{-1}$cm$^{-1}$ for inorganic complexes. For example, the organic dyes in the rhodamine, cyanine, coumarin and xanthene families can have extinction coefficients that approach $10^5$ M$^{-1}$cm$^{-1}$. They can be attached to high surface area solids through chelating carboxyl, hydroxyl, or carbonyl functions.

The use of organic dyes to sensitize solids is well established in the photographic industry where organic dyes are used to sensitize silver halides to radiation from the visible to the infra-red regions of the spectrum (Theory of the Photographic Process, 4$^{th}$ ed., T. H. James, ed., Wiley & Sons: NY, 1974). Cyanine dyes are the preferred sensitizers in these systems and function with high efficiencies to produce latent image centers in silver halide grains. They can be used in their monomeric form or in aggregates that are blueshifted in absorption from the monomer dye absorption or in Jaggregates that are red-shifted. These aggregates increase the light harvesting ability of the silver halide film.

Many attempts have been made to utilize highly absorbing organic dyes in photoelectrochemical solar cells but without the success that has been observed with silver halides or with the transition metal complexes on metal oxide solids. It is evident that organic dyes can be effective at absorbing light and injecting electrons into a solid substrate when attached to the solid with carboxyl or phosphonic acid functions (Burfiendt et al., Zeitschrift fur Physikalische Chemie, Bd. 212, S. 67–75, 1999). Derivatives of chlorophylls and porphyrins with, e.g., carboxyl groups as linkage agents have been found to sensitize nanocrystalline solar cells at conversion efficiencies that approach 3% (Kay et al., J. Phys. Chem. 97:6272–6277, 1993). However, this is only one third of the conversion efficiency of the ruthenium complex N. Even less effective is the use of dyes that are covalently bonded to oxide layers and assembled in a solar cell.

The conversion efficiencies of solar cells sensitized with organic dyes were found to be very low in comparison with the transition metal ruthenium complexes. In addition, the spectral range of the non-aggregated dye is much narrower than that of the transition metal complexes. A typical organic dye absorbs light within a 50 nanometer region of the spectrum and, therefore, absorbs too little of the solar spectrum to be an efficient sensitizer for power conversion in a solar cell.

In theory, dye aggregation could be used in photoelectrochemical solar cells. Such aggregation could shift or broaden the spectral absorption of the dye to enhance its light harvesting ability. It has been shown that organic dyes can attach to the surface of nanocrystalline TiO$_2$ layers in a solar cell as aggregates to influence the spectral range of absorption, but this has resulted in poor sensitization. For example, J-aggregates of chelating merocyanine dyes, red-shifted in their spectral absorption, have been examined in TiO$_2$ solar cells and found to be ineffective (Neusch et al., J. Am. Chem. Soc.118:5420–5431, 1996). Aggregates of simple underivatized oxazines and thiazines in nanocrystalline solar cells have also been found to be poor sensitizers (Liu et al., J. Electrochem. Soc. 143:835, 1995).

It would be desirable to have efficient organic spectral sensitizers for dye-sensitized solar cells that have a significantly greater light harvesting ability than transition metal ruthenium complexes. Such dyes would enable the use of a thinner layer of the solid semiconductor material and would allow greater control over the spectral region of absorption by the sensitizer in the solar cell.

BRIEF SUMMARY OF THE INVENTION

The present invention employs organic dyes in a novel manner to sensitize polycrystalline photoelectrochemical cells, e.g., regenerative solar cells, with efficiencies that can exceed those of transition metal complexes. These sensitizers are attached to the semiconductor solid substrates through at least two linkage functions and can form as efficient coat on the semiconductor of less than four micrometers. The sensitizers of the invention are also useful in single use diodes, which can be employed, e.g., as fluorescing single use insecticide sensors.

The present invention employs organic dyes in a novel manner to sensitize polycrystalline photoelectrochemical cells, e.g., regenerative solar cells, with efficiencies that can exceed those of transition metal complexes. These sensitizers are attached to the semiconductor solid substrates through at least two linkage functions and can form an efficient coat on the semiconductor of less than four micrometers. The sensitizers of the invention are also useful in single use diodes, which can be employed, e.g., as fluorescing single use insecticide sensors.

Thus, in one aspect, the invention is directed to a photo-electric material comprising a semiconductor and an organic photosensitizing dye that is incapable of complexing to a transition metal. The dye is attached to said semiconductor through two or more attachment functions, which are separated from the conjugated portion of the dye by a linkage group that is not in conjugation with the conjugated portion of the dye. Preferably, the semiconductor is a metal oxide, and most preferably, titanium dioxide. The attachment functions are preferably carboxylic acid functions, which are attached to the dye through alkyl linking chains.

BRIEF DESCRIPTION OF THE DRAWINGS

Other features and advantages of the invention will be apparent from the following description of the preferred embodiments thereof and from the claims, taken in conjunction with the accompanying drawings, in which:

DETAILED DESCRIPTION OF THE INVENTION

Figure 1:
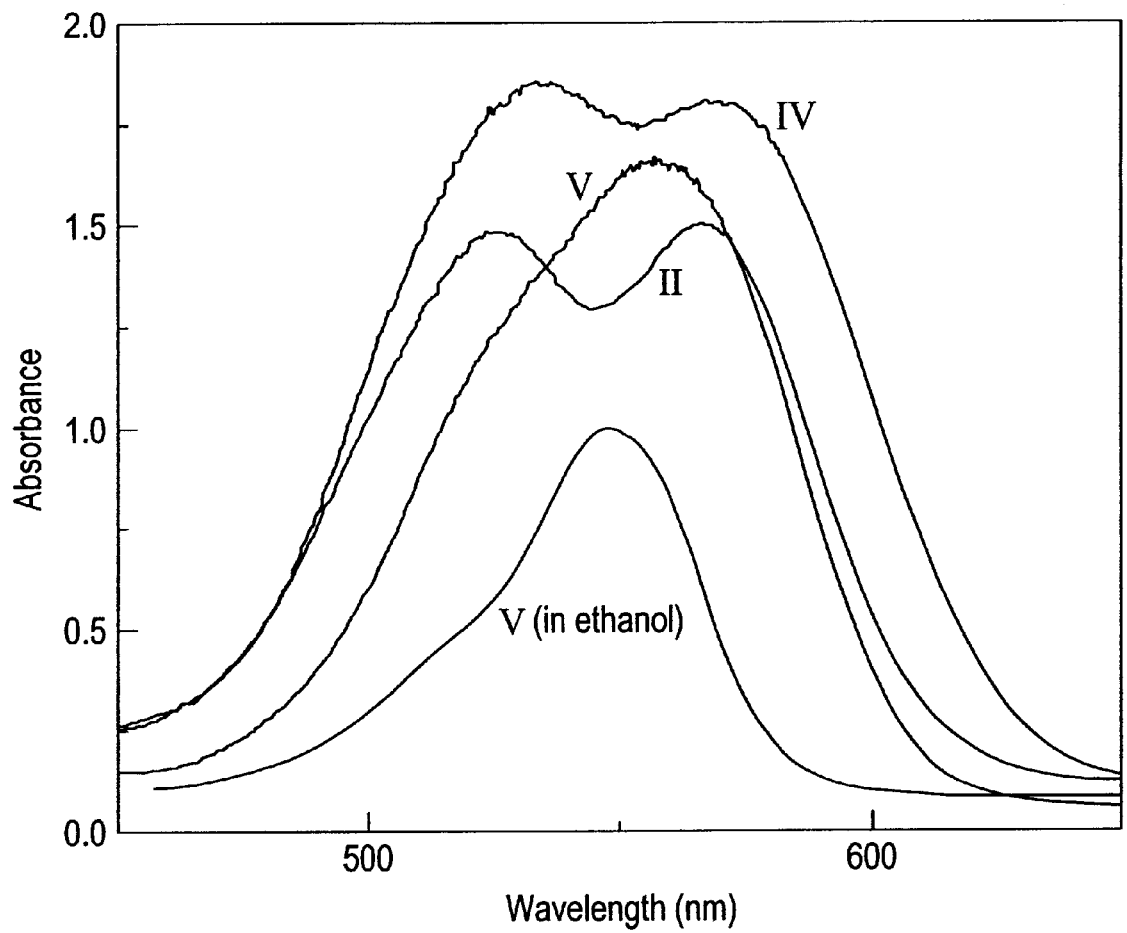
FIG. 1 shows the absorbance of II, IV, and V as monomeric dyes on the surface of 4 micron thick polycrystalline $TiO_2$ layers as well as the absorbance of an ethanolic solution of V.

The photoelectric materials of the invention represent a major improvement in the production of efficient organic spectral sensitizers for dye-sensitized solar cells. A typical organic dye can have an extinction coefficient for absorption of about $10^5$ $M^{-1}cm^{-1}$ or more as compared with $1-3\times10^4$ $M^{-1}cm^{-1}$ for inorganic complexes. For example, the organic dyes in the rhodamine, cyanine, coumarin and xanthene families can have extinction coefficients that approach $10^5$ $M^{-1}cm^{-1}$. They can be attached to high surface area solids through chelating carboxyl, hydroxyl, or carbonyl functions.

The solids to which these dyes are bound or attached in a photo-electrochemical solar cell include all metal oxide substrates that are used in photoelectrochemical investigations. These solids include, but are not limited to, oxides such as titanium dioxide, zinc oxide, strontium titanate, barium titanate, tin oxide, and tungsten trioxide. Both rutile and anatase forms of the titanium dioxide may be employed. Polycrystalline, nanocrystalline, or amorphous forms of the solid can be employed in the solar cells in this invention. Also suitable for use in this application are semiconductors that form oxide layers at the surface to which organic dyes may attach. These include materials such as GaP, ZnP, and ZnS.

The size of the semiconductor particles used in this invention can vary from nanometers to microns in cross section. Colloid particles of the solids of 20 nm dimension are satisfactory as are larger particles in the one micron range. In this invention, the preferred solid is a nanocrystalline titanium dioxide colloid prepared after the manner of Gratzel et al. (U.S. Pat. Nos. 4,927,721 and 5,350,644) or of Gregg (Zaban et al., J. Phys. Chem. B 101:55, 1997), which are estimated to be in the range of 20 nanometers in diameter. These solids are applied to a conducting substrate from a coating solution and allowed to dry.

The coated layers may be heated to improve the electrical connectivity between the particles. The conductive substrate is generally transparent and can be $SnO_2$ on glass or on a flexible plastic base. Other conductive oxides such as thin film ZnO or $WO_3$ are also usable in this role. In this invention the preferred preparation involves a heating of the coated layer on conductive tin oxide glass to 450° C. for a period of thirty minutes.

Generally, the dyes are attached to the surface of the heated solids when they are still warm. The attachment procedure requires immersion of the coated oxide layer into a solution of the dye. The attachment of the solid occurs most readily from dry solvents that contain minimal water content, although for the dyes of this invention, it will proceed in the presence of water at a slower rate. The time of immersion can be as short as five minutes or require as long as twenty four hours. In this invention methanol or ethanol are suitable solvents.

Organic dyes may be attached to the solids through the use of functional attachment linkages on the dyes, which may be of several types. Carboxyl functions are known to be very effective in this role, as are phosphonate linkages. Hydroxyl and carbonyl groups on the dye are also known to coordinate with surface atoms of the solid. The attachment functions themselves are separated from the conjugated portion of the dye by a linkage group that is not in conjugation with that portion of the dye. For example, as in a number of the examples given below, the attachment functions are attached through alkyl linkage chains, e.g., via a ring nitrogen or amine function. Alternatively, attachment of an attachment function can be through, e.g., a phenyl group attached to the meso carbon atom, which, by stearic hindrance, must remain perpendicular to the conjugated portion of the dye.

Representative dyes used in the present invention have structures include the following.

I
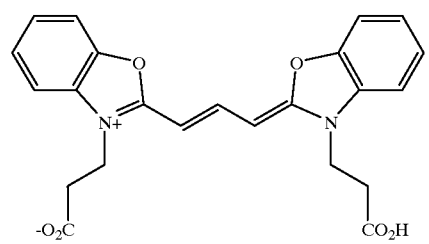
II
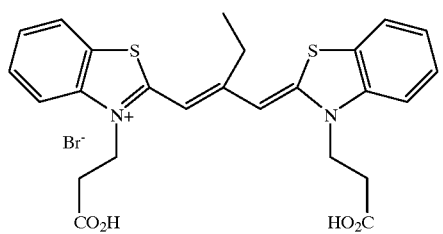
III
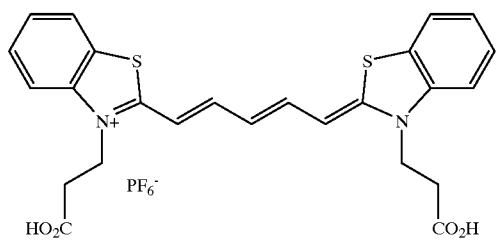
IV
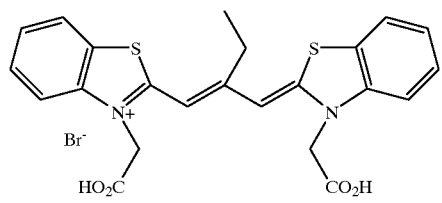
V
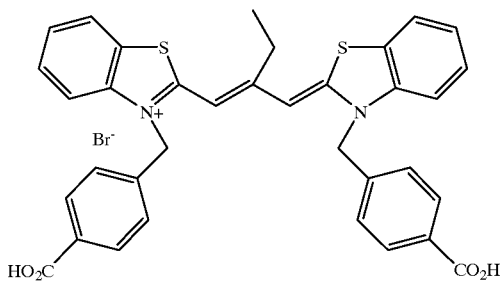
VI
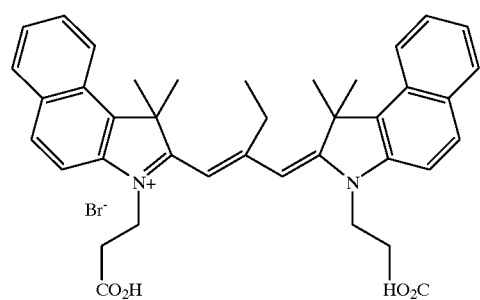
VII
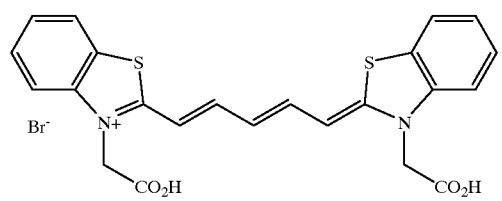
VIII
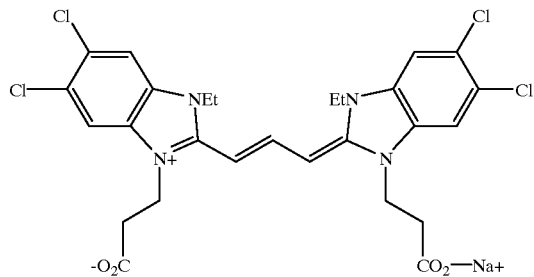
IX
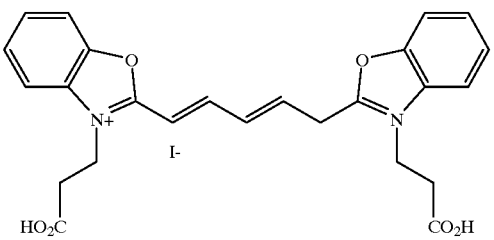
X
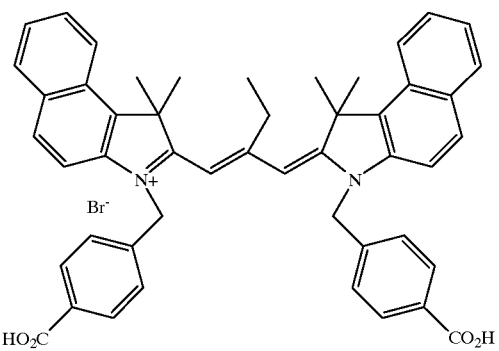
XI
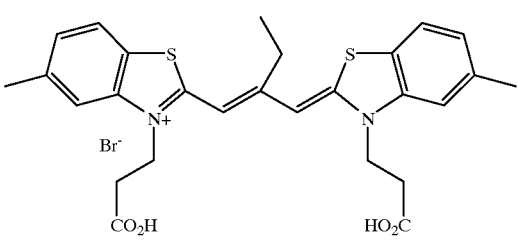

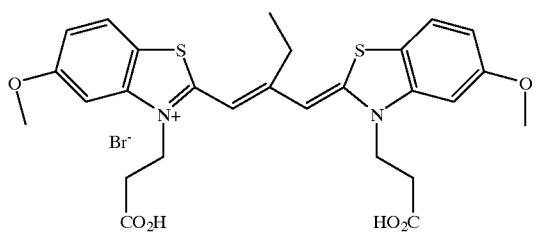

XII

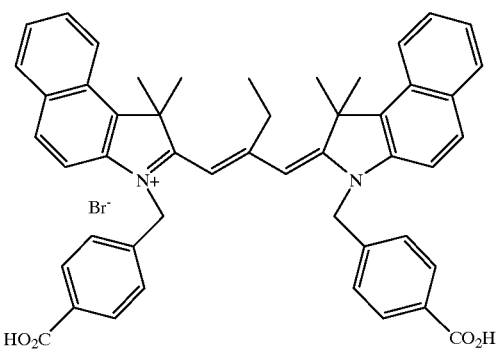

XIII

In the present invention, the dyes are used in their aggregated form and in combination with other dyes to extend the spectral range of absorption of the photoelectrochemical solar cell. The extent of aggregation is controlled by the structure of the functional attachment linkage on the dye or the particular conditions of the exposure of the solid to the organic dye in the attachment procedure. The extent of absorption of light by these dyes on the solid can be demonstrated through the measurement of an absorption spectrum of $TiO_2$ layers subjected to the dye attachment procedure.

The structure of the attaching linkage influences the spectrum of the dye layer on the solid surface. Referring to FIG. 1, dyes containing methylbenzoic acid V, propanoic acid II and ethanoic acid IV linkages were attached to $TiO_2$ nanocrystalline layers, as described in the Examples below, and the absorbance readings versus wavelength determined. In the results reported in FIG. 1, it can be seen that the methylbenzoic acid linkage of V results in a simple absorption similar to the absorption of the unattached monomer dye in ethanol, but red-shifted in spectral absorption owing to the dye's proximity to the high dielectric constant of the $TiO_2$. There is a slight increase in the extinction of the absorption shoulder at a shorter wavelength than the absorption maximum. This increase is known to result from H-aggregation of the dye and is very pronounced in the spectra of II and IV in FIG. 1 and of I, II, and III in FIG. 2. A shorter linkage, such as is found on II or IV, results in the appearance of blue-shifted aggregates of the dye. It can be seen that a greater spectral range of absorption is obtained.

Figure 2:
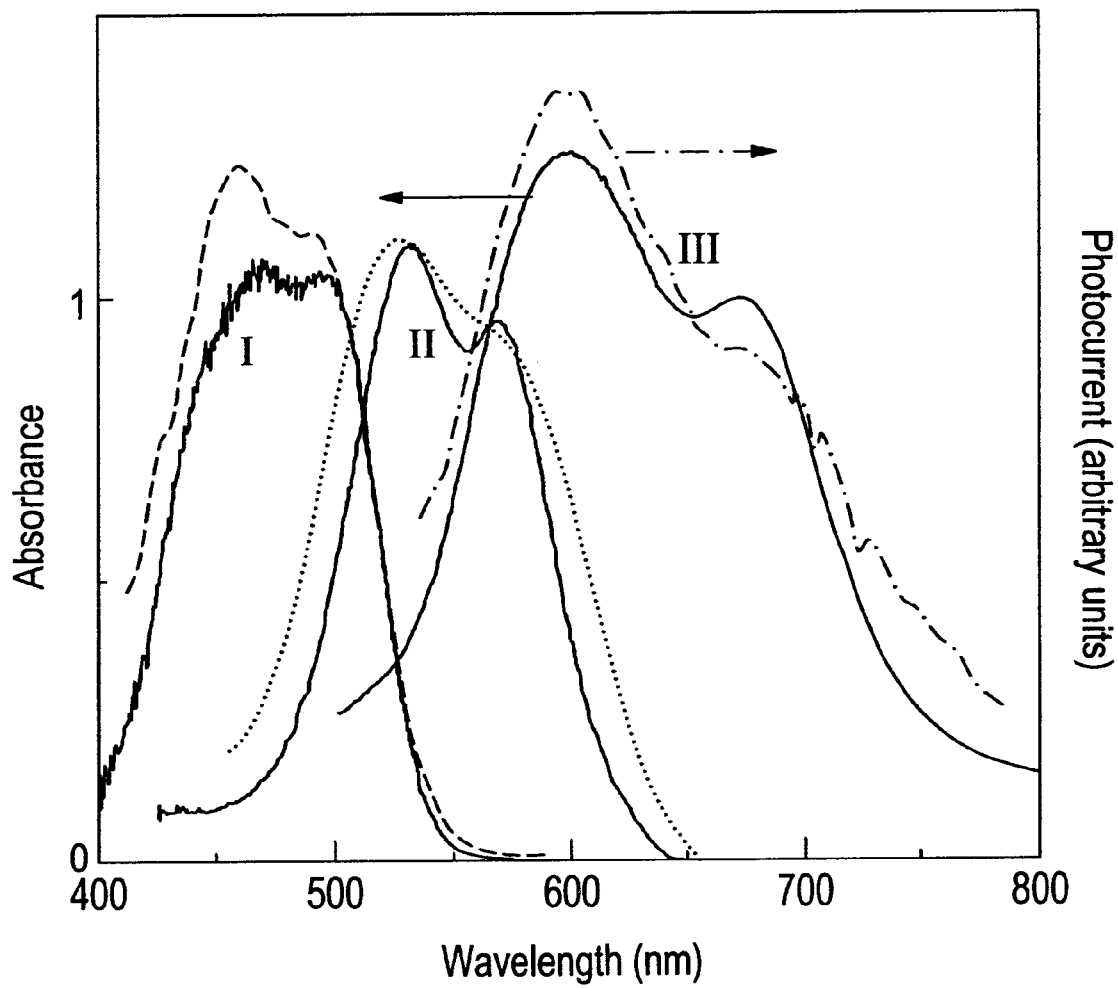
FIG. 2 shows as solid lines the absorbance of I, II, and III as single, monomeric dyes on 4 micron thick polycrystalline $TiO_2$ layers. The photocurrent action spectra of these dyes in solar cells is given as dashed and dotted lines.

Different dyes attached to $TiO_2$ absorb in different regions of the spectrum. This is seen in FIG. 2 where I, II, and III are attached to $TiO_2$ through a propanoic acid linkage. It should be noted that dye analogs of the above list with one carboxyl linkage did not show any absorption in these types of measurements and do not appear to attach to the surface of the solid.

Figure 3:
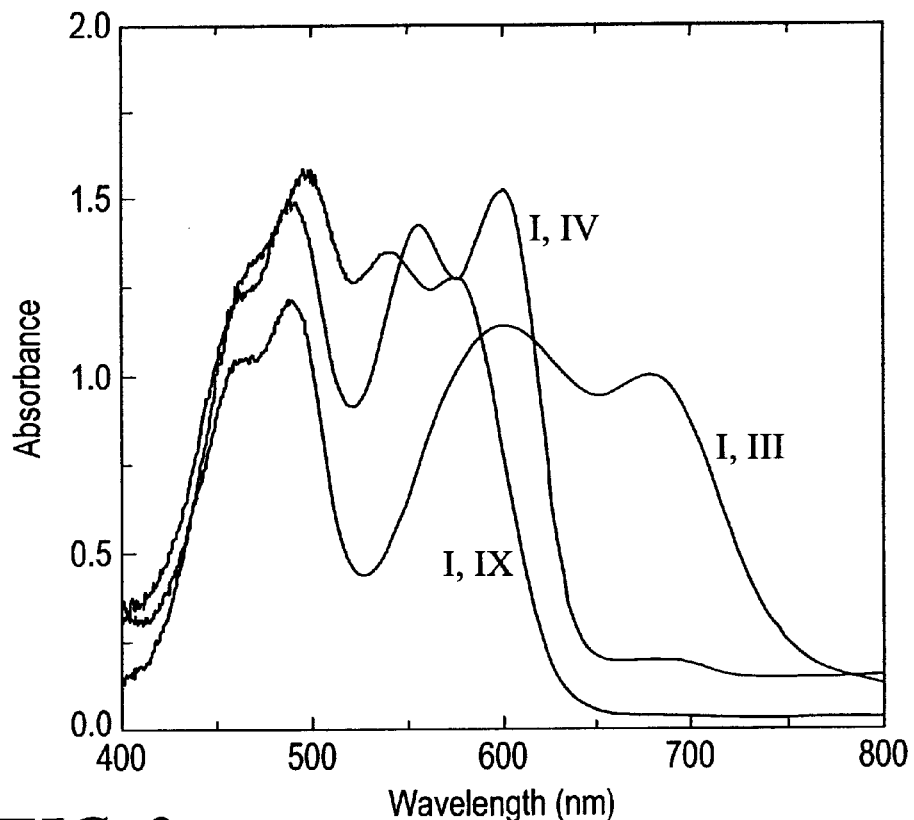
FIG. 3 provides absorbance spectra of mixtures of the indicated dyes attached to 4 micron thick polycrystalline $TiO_2$ layers.
Figure 4:
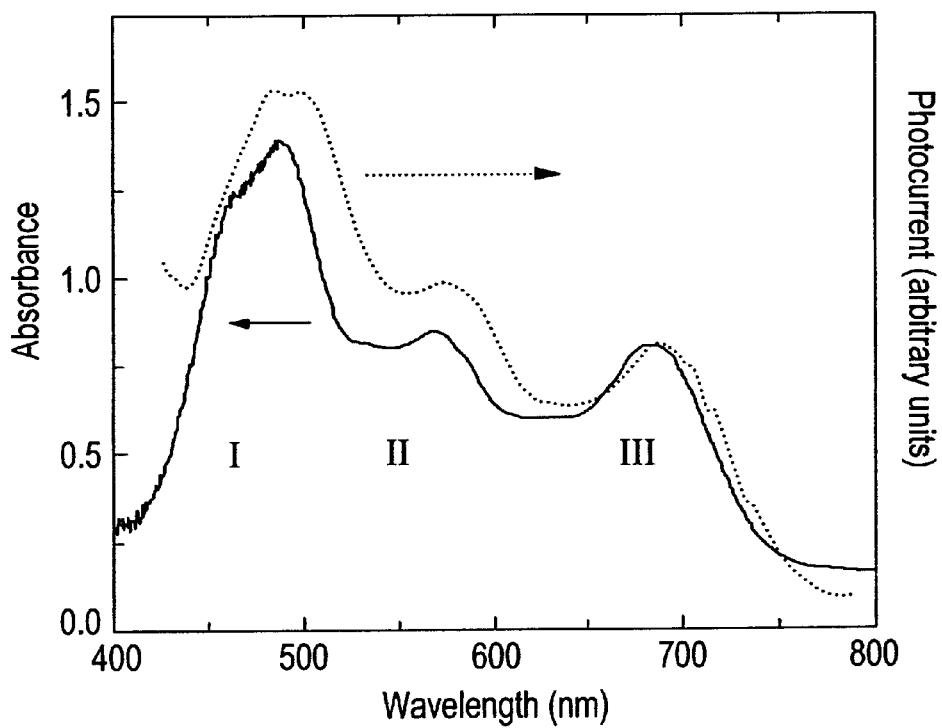
FIG. 4 provides in the solid line an example of the absorbance of a 4 micron thick polycrystalline $TiO_2$ layer that has a mixture of I, II, and III attached to its surface. In a solar cell, this layer presents a photocurrent action spectrum given by the dotted line.

Combinations of dyes can be attached to the surface of $TiO_2$ to extend the spectral range of absorption of the solid surface. A sintered $TiO_2$ layer can be immersed in sequence in ethanolic solutions of IV and I, or III and I, or I and IX with the time of immersion adjusted to obtain balanced attachment of the two dyes. This may require five minutes to two hours immersion in these solutions, the preferred length of immersion being determined empirically. In FIG. 3, it can be seen that the absorption spectrum of these sequential immersions reveals absorption from each of these dyes and extends the range of absorption of the dye-sensitized solid. This can be extended to three dyes, as is shown in FIG. 4, for a combination of I, II, and III.

Figure 5:
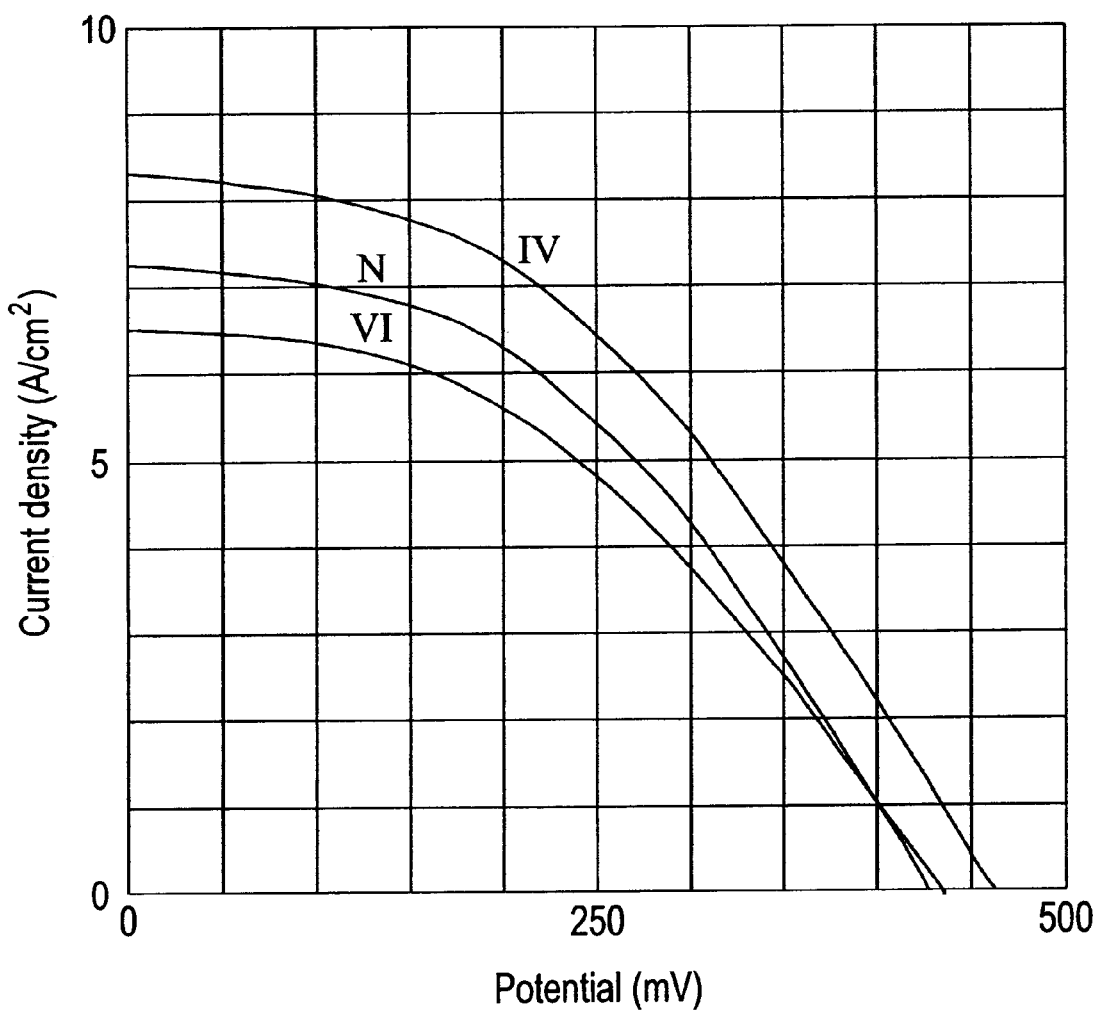
FIG. 5 shows current voltage curves from 4 micron thick solar cells of polycrystalline $TiO_2$ sensitized by various chromophores.

Photoelectrochemical solar cells can be assembled with dye-sensitized nanocrystalline $TiO_2$ layers that have been coated on transparent conducting $SnO_2$ glass. The solar cells are assembled through mating the dyed $TiO_2$ layers with a counterelectrode in the form of transparent conductive $SnO_2$ glass of appropriate size after the manner of Gratzel et al., U.S. Pat. No. 4,927,721). To complete the cell, acetonitrile may be used as a solvent and 0.5 M $I^-$ and 0.030 M $I_2$ as the regenerating agent electrolyte. The edges can be sealed with heat sealable polymers such as DuPont Surlyn or with commercial low temperature heat seal glues. With cell areas of 3 to 4 $cm^2$, solar cells of 4 micrometer thick nanocrystalline $TiO_2$ can be exposed to 110 $W/m^2$ light from a 250 W tungsten lamp to yield the current-voltage curves for VI, IV, and N of FIG. 5. A current-voltage curve for N is included as a positive control to illustrate the efficacy of the photoelectric materials of the invention as sensitizers relative to a known compound such as N. As can be seen, the materials of the invention are as effective as sensitizers as materials currently in use. However, the materials of the invention can be applied to the nanocrystalline layers of the semiconductor (e.g., to the metal oxide layers) in a coating less that 4 micrometers thick, compared to the 10 micrometer minimum required with compound N. With short circuit photocurrents of 5–8 $mA/cm^2$, open circuit voltages of 400–500 mV and fill factors of 70–80%, these cells are seen to attain conversion efficiencies of 4–5%.

In this invention, the aggregates of dyes and combinations of dyes are used to extend the spectral range of sensitivity of the solar cell. This can be demonstrated in a straightforward manner through a measurement of the spectral response of the current from the solar cell in a short circuit configuration, as shown by the solid curves in FIG. 2.

The current response of the solar cells made with the dyed $TiO_2$ layers can be measured as a function of the wavelength of light to which the device is exposed. This current response is represented in FIG. 2 by the dashed or dotted curves and can be seen to correspond to the absorption spectrum. This result shows that the aggregates of the dyes I, II, and III contribute to the current generation in equal parts to monomer forms.

This measurement of the photocurrent action spectrum of the dye-sensitized solar cell for a combination of the dyes depicted in FIG. 2 is displayed in FIG. 4. This action spectrum confirms that all dyes and their aggregates in these mixed-dye solar cells contribute to the power generation of the solar cell in equal proportion.

The following examples are presented to illustrate the advantages of the present invention and to assist one of ordinary skill in making and using the same. These examples are not intended in any way otherwise to limit the scope of the disclosure.

EXAMPLE 1

The synthesis of the quaternary amine salts for use in the invention followed a formula well known to those skilled in the field, an example of which follows:

N-(2-propanoic acid) benzoxazole bromide: 2.0 g of 2-methylbenzothiazole and 2.21 g of 3-bromopropionic acid were added neat to a sealed tube with a stirring bar and heated to 110° C. in an oil bath. The mixture solidified within 30 min of coming to temperature and was held at temperature for an additional 2 h. The tube was removed from the bath and allowed to cool. While the contents were still warm, acetone was added to the solid to break up the mass. The solid was filtered and washed with acetone. The solid produced one spot in a TLC analysis. Yield: 1.57 g or 71%.

EXAMPLE 2

Trimethine dyes such as I were synthesized through the following procedure: 2,2'-(dipropanoic) oxacarbocyanine bromide (1): 320 mg (1.12 mmoles) of N-(2-propanoic acid) benzoxazole bromide was added to 5 ml of acetonitrile along with 120 mg (0.81 mmoles) of triethylorthoformate. 80 mg (0.80 mmoles) of triethylamine was added to the stirring acetonitrile solution. An immediate yellow precipitate formed. The solution was heated to reflux and held for 15 min. The solid was filtered and recrystallized out of ethanol. Yield: 180 mg (62%). The resulting dye gave one spot in TLC analyses and an extinction of $8.5 \times 10^5$ cm$^2$/mmole at 483 nm.

EXAMPLE 3

Pentamethine dyes such as IX were synthesized through the following procedure: 2,2-(dipropanoic) oxadicarbocyanine iodide (IX): The synthesis of IX was based on the procedure in U.S. Pat. No. 5,488,114, Example 2. In a 50 mL round bottom flask with magnetic stirring bar and reflux condenser fitted with an $N_2$ inlet was placed 1.005 g (3.51 mmole) of N-(2-propanoic acid) benzoxazole iodide, 0.288 mL (1.75 mmole) malondialdehyde bisdimethylacetal (Aldrich), and 4.0 mL pyridine. This mixture was stirred under $N_2$ and heated to reflux, during which time the initially pale yellow solution turned from orange to violet-blue. Reflux was continued for 50 min, and the reaction mixture was allowed to cool under $N_2$. To 2 mL of the cooled reaction solution was added 10 mL saturated aqueous KI solution. 2.0 M aqueous HCl was added dropwise until precipitation was obvious (about 10 mL). The solid was isolated by filtration and air dried. Visible spectroscopy revealed an absorption maximum of 582 nm in methanol. This dye can also be isolated as its $PF_6^-$ salt by using $NH_4PF_6$, in place of KI to get a coppery-blue powder that can be recrystallized from warm n-butanol.

EXAMPLE 4

The $TiO_2$ preparation was made using titanium isopropoxide and nitric acid after the manner of Gratzel (U.S. Pat. No. 5,350,644). The initial colloid preparation was ripened through heating the solution in a sealed pressure vessel at 200° C. with stirring for sixteen hours. The solution was sonicated and concentrated and a 20M carbowax binder was added to 40% by weight of the $TiO_2$. Pluronics P103 was used as a surfactant at a 0.5% level. The final solution was 15% by weight of $TiO_2$. The $TiO_2$ preparation was spread on one inch square conductive $SnO_2$ glass using wire wound Mayer rods to control the coating thickness. Coatings with a nominal thickness of 6, 15, 27, 35, 54, and 69 micrometers were obtained. Following coating, the samples were allowed to dry and then heated to 450° C. in 30 min and held there for a further 30 min. The dry solid thickness of these calcined layers was measured with a Dektak profilometer to be 0.9, 2.3, 3.9, 5.1, 8.1, and 10.5 microns.

EXAMPLE 5

Absorption spectra of various attached dyes were determined in the following manner: Solutions of dyes I, II, and III were made at concentrations of $1 \times 10^{-5}$ M to $1 \times 10^{-4}$ M in dry ethanol. $TiO_2$ layers on glass were prepared as in Example 4 and immersed in these ethanolic solutions while still warm. The coated glass was withdrawn from solution after one to two hours and rinsed with ethanol. Absorption spectra of the dyes were recorded with a UV-VIS spectrophotometer to produce spectra such as are given in FIG. 2.

EXAMPLE 6

Attachment of dyes with different lengths of alkyl linkages (e.g., dyes II, IV, and V) to $TiO_2$: Dye solutions of the individual dyes were made and used for immersion of $TiO_2$ layers as in Example 5. Absorption spectra of these dyed coatings revealed differences such as are seen in FIG. 1.

EXAMPLE 7

Nanocrystalline solar cells using various attached dyes were made with these dyed nanocrystalline layers on conductive tin oxide glass by mating them with another 8 ohm, inch square $SnO_2$ element and sealing with low temperature hot melt glue, leaving apertures for insertion of electrolyte. The standard electrolyte composition of 0.50 M NaI/0.05 M $I_2$ in acetonitrile was used. The cells averaged 3.5 cm$^2$ in size.

A 250 W tungsten light source provided the light for exposure. The beam was passed through a water filter and a 420 nm cut-off filter. The power incident on the sample was measured with a calibrated silicon photodiode and estimated to be 110 mW/cm$^2$. I–V curves can be measured as seen in Figure III from which are determined short circuit photocurrents ($i_{ss}$) open circuit voltage ($v_{oc}$) and the fill factor.

The sensitizing ability of the dye in a solar cell is a compound function of the light harvesting ability of the dye and the efficiency of electron transfer from the excited dye to the nanocrystalline solid. A crude measure of this sensitizing ability can be found in the short circuit photocurrents of the solar cell.

In Table I, below, are listed typical short circuit photocurrents for the ruthenium dye N and the cyanine dyes I, II, IX, IV, V, III, VI and N in a 4 micrometer cell. Fill factors ranged from 70–90%.

TABLE I

Typical Short Circuit Photocurrents ($i_{ss}$) and Open Circuit Voltage ($V_{oc}$) for 4 Micrometer Layers

| | $i_{ss}$ (mA/cm$^2$) | $V_{oc}$ (mV) |
|---|---|---|
| I | 2.8–3.2 | 525 |
| II | 3.2–3.4 | 465 |
| IX | 4.8–6.2 | 425 |
| IV | 5.9–6.4 | 450 |
| V | 1.4–1.8 | 390 |
| III | 1.8–2.1 | 380 |
| VI | 4.9–5.7 | 425 |
| N | 5.4–6.3 | 440 |

EXAMPLE 8

Cyanine sensitized solar cells were made at different thicknesses in order to demonstrate that light harvesting with the photoelectric materials of the invention incorporating these organic dyes is optimized at a much thinner cell as compared with materials using N. Observations include short circuit photocurrents that initially increase with thickness and eventually level off. Open circuit voltages (VWc) remain relatively constant. The shapes of the IV curves do change, as they should, with fill factors that reflect the influence of the internal resistance.

Measurements were carried out on cells that varied in thickness from 1 to 10.5 micrometers, using a variety of these cyanine dyes and with N-sensitized $TiO_2$ serving as a control. The $TiO_2$ layers were made as in Example 4 and coated on $SnO_2$ at a thickness ranging from 0.9 to 10.5 micrometers. The coatings were immersed in $5 \times 10^{-4}$ M solutions of N and VI as in Example 5 to produce dyed $TiO_2$ layers. Solar cells were assembled as in Example 7 and current voltage curves recorded. Typical results are provided here for these two chromophores. The short circuit photocurrents saturate at a lower thickness for VI than for N owing to the difference in extinction coefficients:

TABLE II

Comparison of $i_{ss}$ (mA/cm$^2$)

| Coated Thickness (μm) | VI | N |
|---|---|---|
| 0.9 | 1.8 | 2.1 |
| 2.3 | 3.6 | 3.9 |
| 3.9 | 4.3 | 6.3 |
| 5.1 | 5.4 | 7.8 |
| 8.1 | 5.7 | 9.1 |
| 10.5 | | 9.4 |

EXAMPLE 9

Preparation of nanocrystalline layers with dye mixtures can be made with any number of dyes. Specific combinations of dyes can be attached onto the $TiO_2$ layers to yield combination absorption spectra such as are given in FIG. 4. The $TiO_2$ layers prepared as in Example 4 were immersed sequentially in ethanolic solutions of the various dyes. These dye solutions ranged in concentration from $1 \times 10^{-5}$ M to $1 \times 10^{-4}$ M and the time of immersion in each dye solution varied from 15 min to several hours. Spectra such as in FIG. 4 were obtained for $TiO_2$ coatings that were immersed first in the solution of the red-most absorbing dye and then in the solution of the more blue absorbing dye.

EXAMPLE 10

Solar cells can be made with mixtures of dyes. Nanocrystalline $TiO_2$ coatings were made on $SnO_2$ glass as in Example 5 and sensitized with combinations of two dyes as described in Example 10. The dyed $TiO_2$ was assembled into a solar cell and exposed to light as in Example 7 to obtain the short circuit photocurrents and open circuit voltages listed below. They are found to exceed the performance of the control solar cells that employed single dyes alone and the corresponding solar cell with the ruthenium N chromophore.

TABLE III

Mixed Dye Solar Cells at 4 micrometer thickness

| Dye Combination | $I_{ss}$ (mA/cm$^2$) | $V_{oc}$ (mV) |
|---|---|---|
| I IV | 8.3 | 480 |
| I IX | 4.3 | 440 |
| I III | 6.4 | 425 |
| I VI | 6.5 | 450 |
| IX III | 5.7 | 475 |
| I (control) | 2.2 | 460 |
| IV (control) | 5.9 | 440 |
| VI (control) | 5.7 | 425 |
| N (control) | 6.3 | 440 |

While the present invention has been described in conjunction with a preferred embodiment, one of ordinary skill, after reading the foregoing specification, will be able to effect various changes, substitutions of equivalents, and other alterations to the compositions and methods set forth herein. It is therefore intended that the protection granted by Letters Patent hereon be limited only by the definitions contained in the appended claims and equivalents thereof.

What is claimed is:

1. A photoelectric material comprising
a semiconductor; and
an organic photosensitizing dye, said dye comprising a conjugated portion, said dye being incapable of complexing to a transition metal, wherein said dye is attached to said semiconductor through two or more attachment functions, each said attachment function being separated from said conjugated portion of said dye by a linkage group that is not in conjugation with said conjugated portion of said dye.

2. The photoelectric material of claim 1 wherein said semiconductor is a metal oxide.

3. The photoelectric material of claim 2 wherein said metal oxide is titanium dioxide.

4. The photoelectric material of claim 1 wherein said dye is selected from the group consisting of cyanine, oxazine, thiazine and acridine dyes.

5. The photoelectric material of claim 1 wherein said dye is a cyanine dye.

6. The photoelectric material of claim 1 wherein each said attachment function of said dye comprises an alkyl linking chain.

7. The photoelectric material of claim 6 wherein each said alkyl linking chain is connected to said dye through an amine group.

8. The photoelectric material of claim 6 wherein each said alkyl linking chain is connected to said dye through a ring nitrogen atom in a conjugated portion of said dye.

9. The photoelectric material of claim 6 wherein each said alkyl linking chain comprises an aromatic functional group.

10. The photoelectric material of claim 6 wherein each said alkyl linking chain is terminated in a carboxyl group.

11. The photoelectric material of claim 6 wherein each said alkyl linking chain is terminated in a phosphonic acid group.

12. The photoelectric material of claim 6 wherein each said alkyl linking chain is terminated in a salicylic acid group.

13. The photoelectric material of claim 1 wherein said material comprises two or more molecules of a specific said dye attached as aggregates to said semiconductor through said two or more attachment functions.

14. The photoelectric material of claim 1 wherein said material comprises a mixture of two or more said dyes attached to said semiconductor through said two or more attachment functions.

15. A photoelectrochemical cell comprising the photoelectric material of claim 1; and an electrode electrically connected to said photoelectric material.

16. A photoelectrochemical cell comprising a first conductive layer;

the photoelectric material according to claim 1 formed on said first conductive layer;

a conductive medium for charge transport provided on said photoelectric material; and a second conductive layer in contact with said conductive medium.

17. A solar cell comprising a first conductive layer;

the photoelectric material according to claim 1 formed on said first conductive layer;

a conductive medium for charge transport provided on said photoelectric material; and an electrode attached to said conductive medium.

18. A photodiode comprising a first conductive layer;

the photoelectric material according to claim 1 formed on said first conductive layer;

a conductive medium for charge transport provided on said photoelectric material; and an electrode attached to said conductive medium.

* * * * *

UNITED STATES PATENT AND TRADEMARK OFFICE
CERTIFICATE OF CORRECTION

PATENT NO. : 6,359,211 B1
DATED : March 19, 2002
INVENTOR(S) : Mark T. Spitler et al.

It is certified that error appears in the above-identified patent and that said Letters Patent is hereby corrected as shown below:

Column 2,
Line 14, "Jaggregates" should read -- J-aggregates --;
Line 23, "fur" should read -- für --;

Column 3,
Line 4, "as" should read -- an --;
Lines 9-18, "The present invention employs organic dyes in a novel manner to sensitize polycrystalline photoelectrochemical cells, e.g., regenerative solar cells, with efficiencies that can exceed those of transition metal complexes. These sensitizers are attached to the semiconductor solid substrates through at least two linkage functions and can form an efficient coat on the semiconductor of less than four micrometers. The sensitizers of the invention are also useful in single use diodes, which can be employed, e.g., as fluorescing single use insecticide sensors."

should read as follows:

-- The present invention also makes use of aggregates of these organic sensitizers to produce solar cells of wider spectral absorption, high absorbtivity and high power conversion efficiency. Aggregation is controlled through the use of various linkage functions through which the dye is attached to the surface of the semiconductor. In addition, the invention provides the ability to use mixtures of these dyes to broaden the spectral range of sensitization over the visible and near infrared region and thus make high efficiency solar cells. --;

Column 11,
Line 4, "(VW$_c$)" should read -- (V$_{oc}$) --.

Signed and Sealed this

Twenty-ninth Day of October, 2002

Attest:

Attesting Officer

JAMES E. ROGAN
Director of the United States Patent and Trademark Office